United States Patent [19]
Luciano et al.

[11] Patent Number: 6,121,802
[45] Date of Patent: Sep. 19, 2000

[54] METHOD AND CIRCUIT FOR GENERATING TRIANGULAR WAVEFORMS OPPOSITE IN PHASE

[75] Inventors: Giuseppe Luciano, Brugherio; Luca Schillaci, Como, both of Italy

[73] Assignee: STMicroelectronics, S.r.l., Agrate Brianza, Italy

[21] Appl. No.: 09/260,878

[22] Filed: Mar. 2, 1999

[51] Int. Cl.$^7$ .................................................. H03K 4/06
[52] U.S. Cl. ........................................ 327/131; 327/132
[58] Field of Search ................................. 327/131, 132, 327/133, 134, 137, 140

[56] References Cited

U.S. PATENT DOCUMENTS

| | | | |
|---|---|---|---|
| 3,943,446 | 3/1976 | Quidort | 325/144 |
| 4,292,595 | 9/1981 | Smith | 330/10 |
| 4,523,268 | 6/1985 | Brajder et al. | 363/98 |
| 5,013,931 | 5/1991 | Estes, Jr. | 327/140 |

*Primary Examiner*—Tuan T. Lam
*Assistant Examiner*—Linh Nguyen
*Attorney, Agent, or Firm*—Theodore E. Galanthay, Esq.; David V. Carlson, Esq.; Seed IP Law Group, PLLC

[57] ABSTRACT

A circuit and a method generate first and second triangular waveforms opposite in phase to each other. The circuit includes a capacitor having a first plate coupled to a first output at which the first triangular waveform is produced and a second plate coupled to a second output at which the second triangular waveform is produced. First and second switches are coupled between a first voltage reference and the first and second plates, respectively, of the capacitor. The circuit also includes a controller having a first output coupled to the control terminal of the first switch and a second output coupled to a controlled terminal of a second switch. The controller is structured to produce at the first and second outputs respective first and second control signals in opposition to each other and thereby control the first and second switches in opposition to each other. The circuit may include a differential stage having first and second inputs and an output with the first input being coupled to a second voltage reference and the output being coupled to the capacitor. A first resistor may be coupled between the first output of the circuit and the second input of the differential stage and a second resistor may be coupled between the second output of the circuit and the second input of the differential stage. Such a differential stage and resistors insure that the average value of the triangular waveforms is equal to the second voltage reference.

20 Claims, 4 Drawing Sheets

METHOD AND CIRCUIT FOR GENERATING TRIANGULAR WAVEFORMS OPPOSITE IN PHASE

TECHNICAL FIELD

The present invention relates to circuits for generating waveforms, and particularly, to circuits for generating triangular waveforms.

BACKGROUND OF THE INVENTION

For some applications, such as pulse wave modulation (PWM) mode for a hard disk voice coil driver, there is a need to generate two triangular waveforms with the same frequency and amplitude, but opposite in phase. An example of a prior art voice coil driver 10 driving a voice coil 12 is shown in FIG. 1. The voice coil driver 10 includes first and second high side driving transistors 14, 16 and first and second low side driving transistors 18, 20 forming a bridge circuit 22 with the voice coil 12. The bridge circuit 22 also includes a sense resistor 24 from which a sense or error amplifier (not shown) senses current through the voice coil 12 in order to provide a feedback control of that current as is known in the art. The voice coil driver 10 also includes a single waveform generator 26 directly coupled to a first input of a first control amplifier 28 and coupled through an inverter 30 to a first input of a second control amplifier 32. The first control amplifier 28 also includes a second input coupled to voltage reference Vref and an output coupled to the gates of the first high side transistor 14 and the first low side transistor 18. Similarly, the second control amplifier 34 has a second input coupled to the voltage reference Vref and an output wounded coupled to the gates of the second high side transistor 16 and the second low side transistor 20.

In PWM mode, the voice coil driver 10 drives current through the voice coil 12 in either direction by varying the duty cycles of the control signals that are supplied by the first and second control amplifiers 30, 34. To drive current from left to right through the voice coil 12, the duty cycle of the signal driving the first high side and first low side transistors 14, 18 should be greater than the duty cycle of the control signal driving the second high side and second low side transistors 16, 20. Conversely, the relative duty cycles are reversed to drive current from right to left through the voice coil 12. If the duty cycles are equal, then no current is driven through the voice coil 12.

The single waveform generator 26 generates a first triangular waveform by charging and discharging a capacitor (not shown). The waveform generator 26 transmits the first triangular waveform to the inverter 30 which produces a second triangular waveform equal in amplitude and frequency to the first triangular waveform, but opposite in phase. The first triangular waveform is compared to Vref by the first control amplifier 28 to obtain a first square wave control signal and the second triangular waveform is compared to Vref by the second control amplifier 32 to create a second square wave control signal. FIG. 2(a) shows the first and second (dashed line) triangular signals together with Vref, FIG. 2(b) shows the first square wave control signal, and FIG. 2(c) shows the second square wave control signal, assuming ideal conditions.

The problem with the voice coil driver 10 shown FIG. 1 is that the inverter 30 produces a second triangular signal that is not exactly equal in amplitude and opposite in phase to the first triangular signal. The two triangular signals typically differ because of the delays inherent in the inverter itself. As shown in FIG. 3(a) the second triangular signal lags the first triangular signal which causes the second square wave control signal to lag the first square wave control signal as shown in FIG. 3(b). In addition, the inverter 30 typically does not have a gain of exactly unity, so the second triangular signal may have an amplitude that is greater or less than the amplitude of the first triangular signal. For example, FIG. 4(a) shows the second triangular signal having an amplitude greater than that of the first triangular signal, which causes the second square wave control signal to have a greater amplitude than the first square wave control signal. Such an increased amplitude would tend to drive current from right to left through the voice coil 12 in an amount greater than desired.

SUMMARY OF THE INVENTION

An embodiment of the invention is directed to a circuit and method for generating first and second triangular waveforms of the same frequency and amplitude but opposite in phase to each other. The circuit and method produce the first and second triangular waveforms simultaneously from opposite plates of a main capacitor rather than inverting the first triangular waveform to obtain the second. The circuit and method use the same control system to produce both triangular waveforms by charging and discharging the capacitor, which eliminates the amplitude and delay mismatches that characterize the prior art circuits for creating such triangular waveforms.

The circuit includes first and second switches coupled between a first voltage reference and the first and second plates, respectively, of the capacitor. The circuit also includes a controller having a first output coupled to the control terminal of the first switch and a second output coupled to a controlled terminal of a second switch. The controller is structured to produce at the first and second outputs respective first and second control signals in opposition to each other and thereby control the first and second switches in opposition to each other.

The circuit may include a differential stage having first and second inputs and an output with the first input being coupled to a second voltage reference and the output being coupled to the capacitor. A first resistor may be coupled between the first output of the circuit and the second input of the differential stage and a second resistor may be coupled between the second output of the circuit and the second input of the differential stage. Such differential stage and resistors insure that the average value of the triangular waveforms is equal to the second voltage reference.

The controller may include a comparator having first and second outputs coupled to the control terminals of the first and second switches, respectively, a first input coupled to one of the first and second outputs of the circuit, and a second input coupled to a signal reference. The signal reference switches back and forth between a maximum signal reference and a minimum signal reference. By comparing one of the first and second triangular waveforms to the maximum and minimum signal references, the comparator limits the first and second triangular waveforms to values between the minimum and maximum signal references by switching on and off the first and second switches based on the comparisons.

The method produces the first triangular waveform by charging and discharging the capacitor in a first direction and produces the second triangular waveform by charging and discharging the same capacitor in the opposite direction. The method includes connecting the first plate to a first low voltage reference to cause the first triangular waveform to fall. In response to either detecting that the first triangular voltage has reached a second low voltage reference or detecting that the second triangular voltage has reached a high voltage reference, the first plate is disconnected from the first low voltage reference and the second plate is connected to the first low voltage reference. In response to either detecting that the first triangular voltage has reached the high voltage reference or detecting that the second triangular voltage has reached the second low voltage reference, the second plate is disconnected from the first low voltage reference and the first plate is reconnected to the first low voltage reference.

DETAILED DESCRIPTION

Figure 1:
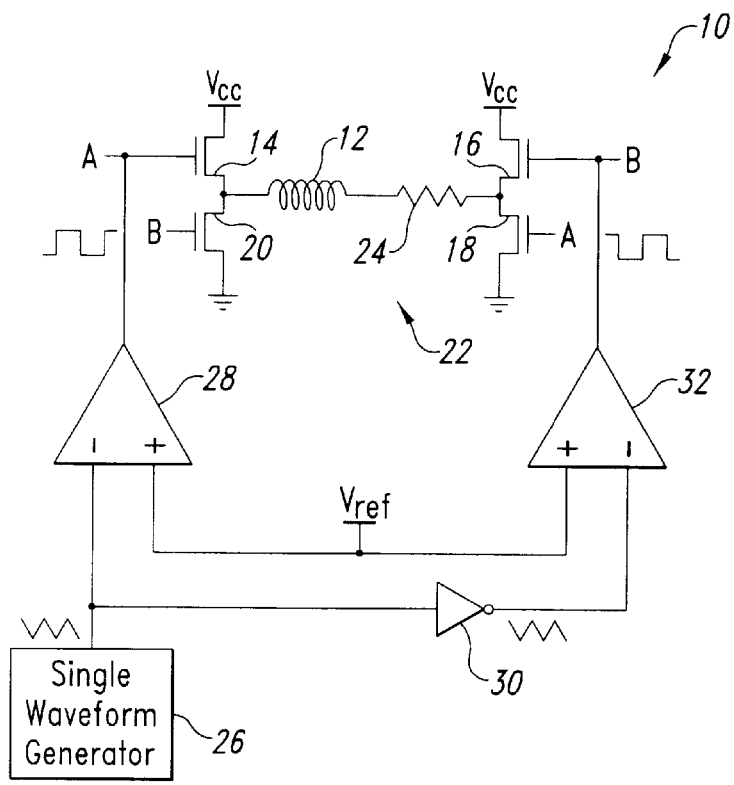
FIG. 1 is a circuit diagram of a prior art voice coil motor driver.
Figure 2A:
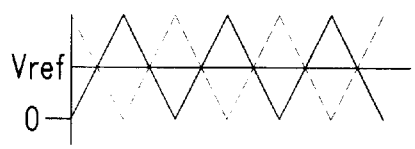
FIG. 2 shows waveforms generated by the voice coil driver of FIG. 1 in an ideal condition.
Figure 2B:
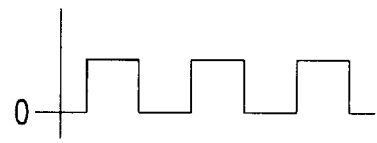
Figure 2C:
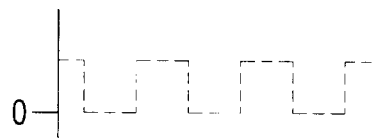
Figure 3A:
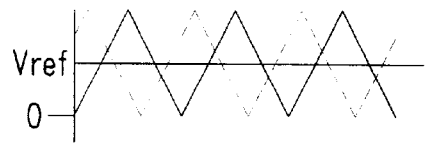
FIG. 3 shows waveforms generated by the voice coil driver of FIG. 1 in view of a delay caused by an inverter of the voice coil driver.
Figure 3B:
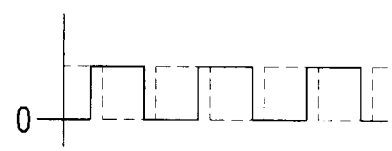
Figure 4A:
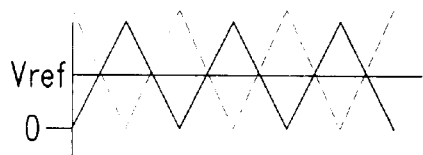
FIG. 4 shows waveforms generated by the voice coil driver of FIG. 1 in view of a non-unity gain of the inverter in the voice coil driver of FIG. 1.
Figure 4B:
Figure 5:
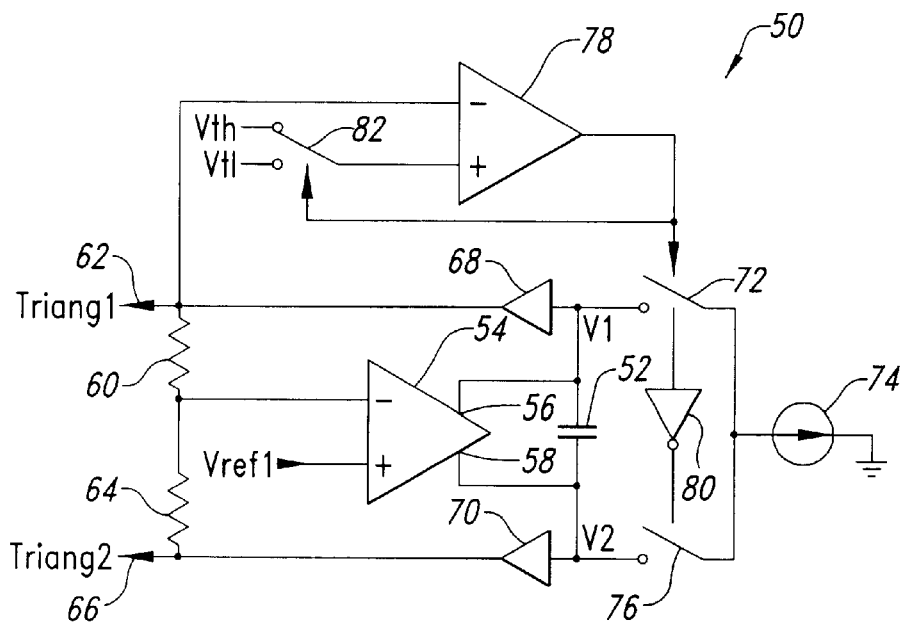
FIG. 5 is a circuit diagram of a circuit for producing triangular waveforms according to an embodiment of the present invention.

A waveform generator circuit 50 according to an embodiment of the present invention is shown in FIG. 5. The waveform generator circuit 50 differs from prior art circuits by generating two triangular waveforms simultaneously from a main capacitor 52. Generating the two triangular waveforms simultaneously from the same capacitor eliminates the delay and non-unity gain of the inverter 30 shown in the prior art circuit of FIG. 1.

The circuit 50 includes a differential amplifier 54 having a first output 56 coupled to a first plate of the main capacitor 52 and a second output 58 coupled to a second plate of the main capacitor 52. The differential amplifier 54 includes a non-inverting input coupled to a voltage reference (Vref1) and an inverting input coupled by a first resistor 60 to a first output terminal 62 and by a second resistor 64 to a second output terminal 66. The first and second outputs of the differential amplifier 54 are each directly related in the same manner to the difference between the non-inverting and inverting inputs of the differential amplifier. A first buffer 68 couples the first plate of the main capacitor 52 to the first output terminal 62 and a second buffer 70 couples the second plate of the main capacitor to the second output terminal 66.

A first switch 72 couples the first plate of the main capacitor 52 to ground via a current generator 74 and a second switch 76 couples the second plate of the main capacitor to ground via the current generator 74. A comparator 78 has an output that controls the first switch 72 directly and the second switch 76 via an inverter 80. The comparator 78 includes an inverting input coupled to the first output terminal 62 and a non-inverting input coupled to a high signal reference (Vth) and a low signal reference (Vtl) by a third switch 82. The output of the comparator 78 is coupled to the third switch 80 to alternately connect the high signal reference Vth or the low signal reference Vtl to the non-inverting input of the comparator.

The circuit simultaneously produces the rising portion of the first triangular signal (Triang1) and the falling portion of the second triangular signal (Triang2) by opening the first switch 72 and closing the second switch 76. Closing the second switch 76 connects the second plate of the main capacitor 52 to ground which drives the voltage V2 at the second plate toward ground and, since the second output terminal 66 is connected to the second plate via the unity buffer 70, Triang2 to is also driven towards ground. Opening the first switch 72 disconnects the first plate of the main capacitor 52 from ground and allows the differential amplifier 54 to drive the voltage V1 at the first plate of the main capacitor upward and, since the first output terminal 62 is connected to the first plate via the unity buffer 68, Triang1 is also driven upward. The rising and falling slopes of both Triang1 and Triang2 are determined by the same capacitor 52, so the two triangular waveforms have the same shape but opposite in phase.

The voltage divider formed by the first and second resistors 60, 64, in connection with the differential amplifier 54, insures that the average value of the first and second triangular signals Triang1, Triang2 are substantially equal to the voltage reference Vref. It will be appreciated that the two resistors 60, 64 should be matched as exactly as possible to ensure that the average value of each of the triangular signals are equal to each other and to Vref.

The first and second switches 72, 76 are controlled by the comparator 78 based on its comparison of the first triangular signal Triang1 alternately with the high signal reference Vth and the low signal reference Vtl. Those signal references establish the upper limit (Vth) and the lower limit (Vtl), respectively, for the first and second triangular signals Triang1, Triang2. When Triang1 is rising (the first switch 72 is open), the third switch 82 has connected the non-inverting input of the comparator 78 to the high signal reference Vth. When Triang1 reaches the level of Vth, then the output of the comparator 78 closes the first switch 72 and opens the second switch 76. As discussed above, closing the first switch 72 causes Triang1 to begin falling and opening the second switch 76 causes Triang2 to begin rising.

Switching the output of the comparator 78 to a low logic level also switches the third switch to connect the non-inverting input of the comparator 78 to the low signal reference Vtl. When the level of Triang1 reaches Vtl, the output of the comparator 78 switches to a high logic level which opens the first switch 72 and closes the second switch 76. As discussed above, opening the first switch 72 causes Triang1 to begin rising and closing the second switch 76 causes Triang2 to begin falling. Switching the output of the comparator 78 to a high logic level also switches the third switch to connect the non-inverting input of the comparator 78 to the high signal reference Vth and the process repeats itself.

It will be appreciated that the same functionality could be obtained by connecting the second output 66, rather than the first output 62, to the inverting input of the comparator 78 in order to compare Triang2 to the high and low signal references Vth, Vtl. Of course, small adjustments would need to be made to ensure that the first switch 72 is closed and the second switch 76 is open when Triang2 is being compared to Vth to insure that Triang2 does not reach an undesirably high level. For example, the output of the comparator 78 could be coupled directly to the second switch 76 and by the inverter 80 to the first switch 72 or the third switch 82 could be connected in an opposite manner to that discussed above.

Figure 6A:
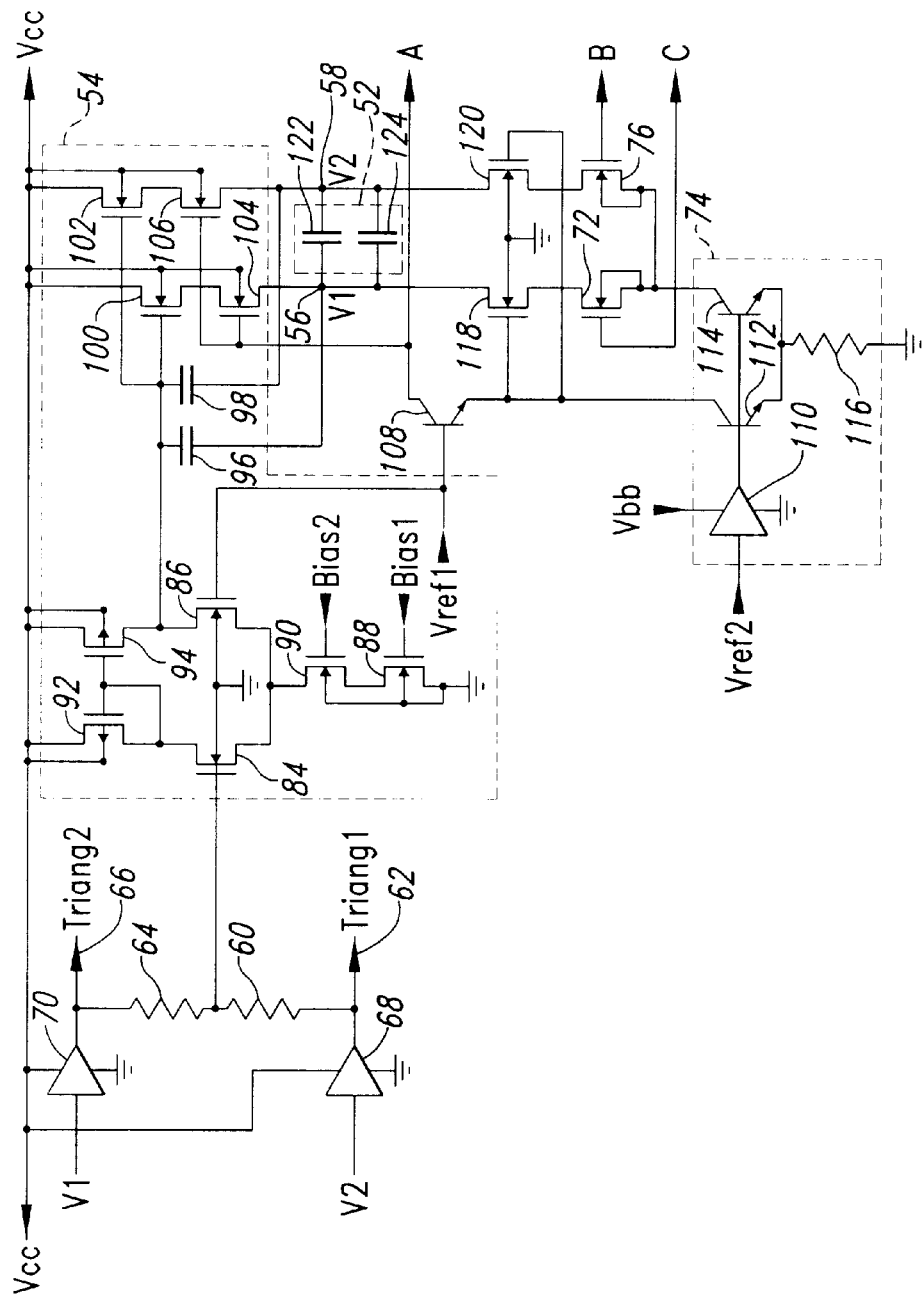
FIGS. 6A and 6B are a more detailed circuit diagram of the circuit shown in FIG. 5.
Figure 6B:
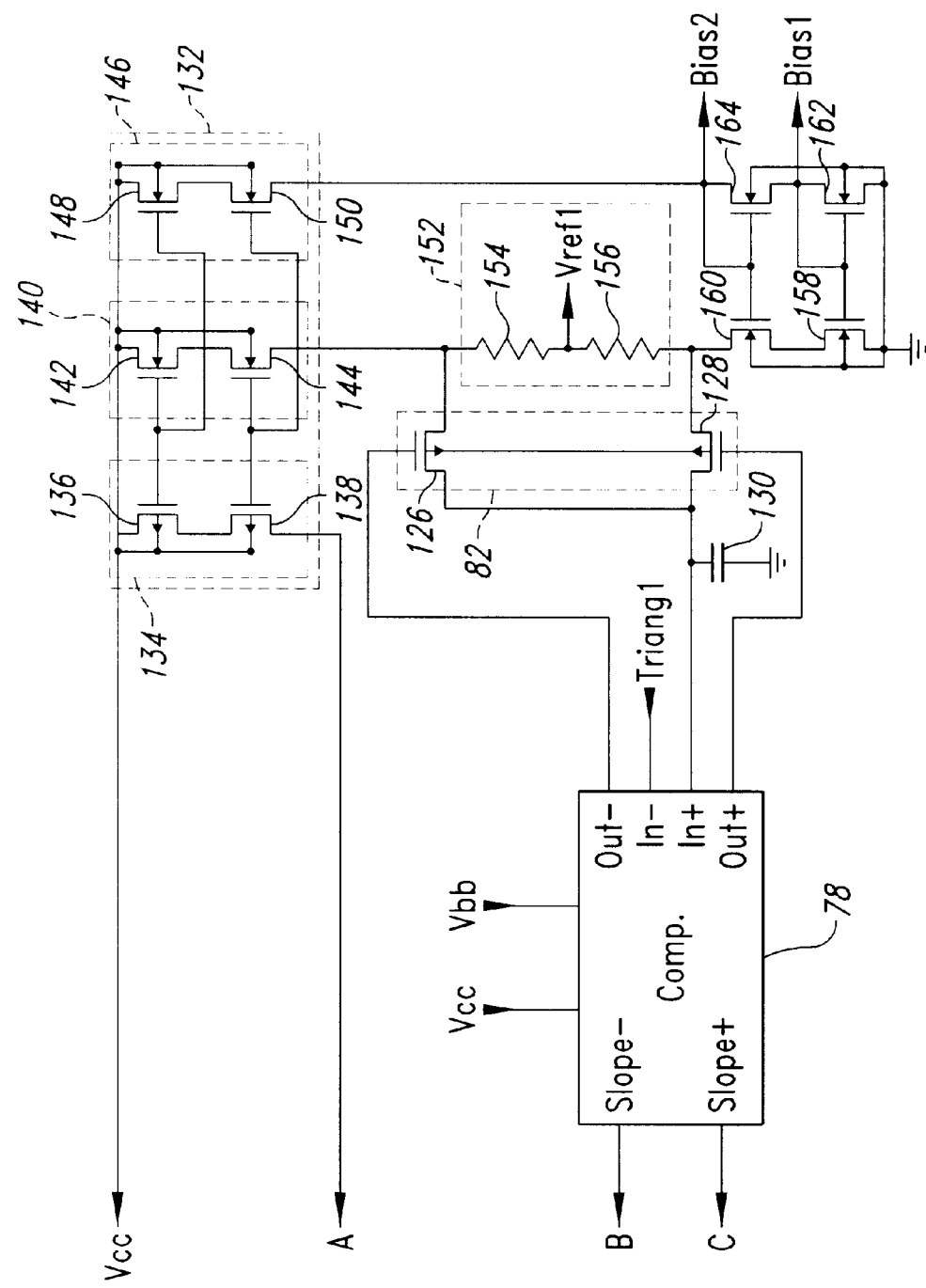

A more detailed circuit diagram of the generating circuit 50 is shown in FIGS. 6A and 6B. Many of the circuit elements in FIGS. 6A and 6B are configured exactly as shown in FIG. 5, and thus, a detailed discussion of those elements will not be repeated.

Beginning with FIG. 6A, the differential amplifier 54 has a differential pair of first and second NMOS transistors 84, 86 having their sources connected together and connected to ground via a pair of series-connected NMOS transistors 80, 90. The series connected NMOS transistors 88, 90 have their gates connected to bias signals Bias1, Bias2, respectively, that are selected to maintain those transistors in an ON state to effectively keep the sources of the transistors 84, 86 of the differential pair at a level close to ground.

The differential pair NMOS transistors 84, 86 have their drains connected through respective PMOS transistors 92, 94 to a power supply Vcc. The gate of the first NMOS transistor 84 of the differential pair acts as the inverting input of the differential amplifier 54 and is connected to the midpoint of the voltage divider formed by the pair of resistors 60, 64. The gate of the second NMOS transistor 86 of the differential pair acts as the non-inverting input of the differential amplifier 54 and is connected to a voltage reference Vref1. The source of the second NMOS transistor 86 acts as the output terminal of the differential pair and presents an output voltage that is directly related to the difference between the voltage at the gate of first NMOS transistor 84 and the voltage at the gate of the second NMOS transistor 86.

The output of the differential pair (source of the second NMOS transistor 86) is coupled to the first and second outputs 56, 58 of the differential amplifier 54 by first and second coupling capacitors 96, 98, respectively. In addition, the output of the differential pair is also coupled to the gates of respective third and fourth PMOS transistors 100, 102. The third PMOS transistor 100 is coupled between a first power supply Vcc and the first output 56 of the differential amplifier 54 by a fifth PMOS transistor 104. Similarly, the fourth PMOS transistor 102 is coupled between the first power supply Vcc and the second output 58 of the differential amplifier 54 by a sixth PMOS transistor 106. The gates of the fifth and sixth PMOS transistors 104, 106 are coupled to the emitter of a first NPN transistor 108 whose collector is coupled to the current source 74 and whose base is driven by the first voltage reference Vref1.

The current source 74 includes a third buffer 110 powered by a second power supply Vbb and having a second voltage reference Vref2 as an input. The output of the third buffer 110 is coupled to the bases of respective second and third NPN transistors 112, 114. The emitters of the second third NPN transistors 112, 114 are coupled together and are coupled by a resistor 116 to ground. The collectors of the second and third NPN transistors 112, 114 act as first and second pull-down nodes, respectively. The third buffer 110 keeps the second and third NPN transistors 112, 114 in a conducting state so that the first and second pull-down nodes are driven towards ground.

The first and second switches 72, 76 are each implemented as NMOS transistors and have their sources connected to the second pull-down node of the current source of 74. The drain of the first switch 72 is coupled to the first output 56 of the differential amplifier 54 and to the first plate of the capacitor 52 by an NMOS transistor 118 whose gate is coupled to the first pull-down node of the current source 74. Similarly, the drain of the second switch 76 is coupled to the second output 58 of the differential amplifier 54 and to the second plate of the capacitor 52 by another NMOS transistor 120 whose gate is also coupled to the first pull-down node of the current source 74. The main capacitor 52 is comprised of first and second main capacitors 122, 124.

Referring now to FIG. 6B, the comparator 78 has four output terminals: Out−, Out+, Slope−, and Slope+. The output terminals Out+ and Slope+ are each directly related to the difference between the non-inverting input terminal (In+) and the inverting input terminal (N−) while Out− and Slope− are each inversely related to that difference. The Slope+ terminal is connected (connection C) to the gate of the first switch 72 and the Slope− terminal is connected (connection B) to the gate of the second switch 76. It will be appreciated that since the implementation of the comparator 78 includes both a positive difference output terminal (Slope+) and its inverse (Slope−), the separate inverter 80 shown in FIG. 5 is not needed in the implementation of FIGS. 6A–6B.

The third switch 82 is implemented with seventh and eighth PMOS transistors 126, 128. The first output 62 is coupled to the inverting input of the comparator 78 and the drains of the seventh and eighth PMOS transistors 126, 128 are coupled together to the non-inverting input of the comparator 78 and by a capacitor 130 to ground. The gate of the seventh PMOS transistor 126 is coupled to the Out− terminal of the comparator 78 and the gate of the eighth PMOS transistor 128 is coupled to the Out+ terminal. The source of the seventh PMOS transistor 126 is coupled to the high signal reference Vth and the source of the eighth PMOS transistor 128 is coupled to the low signal reference Vtl.

When the Out+ terminal is low (meaning that In− is greater than In+), then the eighth PMOS transistor 128 will be conducting to connect the low signal reference Vtl to the non-inverting input In+. Further, the Out− terminal will be high which opens the seventh PMOS transistor 126 and disconnects the non-inverting terminal from the high signal reference Vth. When Triang1 at the first output terminal 62 reaches the low signal reference Vtl, the Out+ terminal switches to logic high and the Out− terminal switches to a logic low which closes the seventh PMOS transistor 126 and opens the eighth PMOS transistor 128. This allows Triang1 to be compared to the high signal reference Vth which is coupled by the seventh PMOS transistor 126 to the non-inverting input In+ of the comparator 78. When Triang1 reaches the high signal reference Vth, the logic state of Out+ and Out− are reversed which opens the seventh PMOS transistor 126 opens the eighth PMOS transistor 128 and the process repeats itself.

The high and low signal reference Vth, Vtl are generated using a double current mirror 132 coupled to the collector of the first NPN transistor 108 (connection AA). The double current mirror includes a first mirror stage 134 having a first pair of series-connected NMOS transistors 136, 138 coupled between the first power supply Vcc and the collector of the first NPN transistor 108; a second mirror stage 140 having a second pair of series-connected NMOS transistors 142, 144 coupled between Vcc and the source of the seventh PMOS transistor 126; and a third mirror stage 146 having a third pair of series-connected NMOS transistors 148, 150 coupled to Vcc. The gates of the NMOS transistors 136, 142, 148 are coupled together, as are the gates of the NMOS transistors 138, 144, 150.

The high and low signal references Vth, Vtl and the first voltage reference Vref1 are produced using a voltage divider 152 coupled between the sources of the seventh and eighth PMOS transistor 126, 128. The voltage divider 152 includes third and fourth series-connected resistors 154, 156 with the first voltage reference Vref1 being taken from the node connecting those resistors. The voltage divider 152 is coupled to ground by a pair of series-connected NMOS transistors 158, 160. The gates of the NMOS transistors 158, 160 are coupled to the gates of corresponding diode-connected NMOS transistors, 162, 164 coupled in series between the third stage 146 of the double current mirror 132 and ground. The gate/drain of the NTMOS transistor 162 supplies the first bias value Bias1 to the gate of the NMOS transistor 88 and the gate/drain of the NMOS transistor 164 supplies the second bias value Bias2 to the gate of the NMOS transistor 90.

It will be appreciated based on the foregoing discussion, that the embodiments of the present invention produce a pair of triangular signals of equal amplitude and frequency but of opposite phases. By producing the triangular waveforms simultaneously from opposite plates of a main capacitor rather than inverting the first triangular waveform to obtain the second, the embodiments eliminates the delay mismatch that characterize the prior art circuits for creating such triangular waveforms. Moreover, the embodiments use the same control system to produce both triangular waveforms by charging and discharging the capacitor, which eliminates the amplitude mismatch that characterize those prior art circuits.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A circuit for generating first and second triangular waveforms opposite in phase to each other, the circuit comprising:
   a first capacitor having a first plate coupled to a first output at which the first triangular waveform is produced and a second plate coupled to a second output at which the second triangular waveform is produced;
   a first switch coupled between the first plate of the first capacitor and a first voltage reference and having a control terminal;
   a second switch coupled between the second plate of the first capacitor and the first voltage reference and having a control terminal; and
   a controller having a first output coupled to the control terminal of the first switch and a second output coupled to the control terminal of the second switch, the controller being structured to produce first and second control signals at said first and second outputs, respectively, in opposition to each other and thereby control the first and second switches in opposition to each other.

2. The circuit of claim 1 wherein the controller includes a comparator having first and second outputs coupled to the first and second outputs of the controller, respectively, the comparator also having a first input coupled to one of the first and second outputs of the circuit and a second input coupled to a signal reference.

3. The circuit of claim 2, further comprising:
   a third switch coupled between the signal reference and the second input of the comparator wherein the signal reference is a maximum voltage reference for the first and second triangular waveforms, the third switch having a control terminal coupled to the first output of the comparator; and
   a fourth switch coupled between a minimum voltage reference and the second input of the comparator, the fourth switch having a control terminal coupled to the second output of the comparator.

4. The circuit of claim 3 wherein the first input of the comparator is coupled to the first output of the circuit and the comparator is structured to turn "off" the third switch and turn "on" the fourth switch in response to the first triangular waveform attaining the maximum voltage reference and is structured to turn "on" the third switch and turn "off" the fourth switch in response to the first triangular waveform attaining the minimum voltage reference.

5. The circuit of claim 1, further comprising:
   a differential stage having first and second inputs and an output, the first input being coupled to a second voltage reference and the output of the differential stage being coupled to the first capacitor;
   a first resistor coupled between the first output of the circuit and the second input of the differential stage; and
   a second resistor coupled between the second output of the circuit and the second input of the differential stage.

6. The circuit of claim 5, further comprising:
   a second capacitor coupled between the output of the differential stage and the first plate of the first capacitor; and
   a third capacitor coupled between the output of the differential stage and the second plate of the first capacitor.

7. The circuit of claim 1, further comprising a second capacitor in parallel with the first capacitor.

8. The circuit of claim 1 wherein the controller includes a comparator having first and second outputs coupled to the first and second outputs, respectively, of the controller, the comparator also having a first input coupled to one of the first and second outputs of the circuit and a second input coupled to a signal reference, the circuit further comprising:
   a third switch coupled between the signal reference and the second input of the comparator wherein the signal reference is a maximum voltage reference for the first and second triangular waveforms, the third switch having a control terminal coupled to the first output of the comparator;
   a fourth switch coupled between a minimum voltage reference and the second input of the comparator, the fourth switch having a control terminal coupled to the second output of the comparator;
   a differential stage having first and second inputs and an output, the first input of the differential stage being coupled to a second voltage reference and the output of the differential stage being coupled to the first capacitor;
   a first resistor coupled between the first output of the circuit and the second input of the differential stage; and
   a second resistor coupled between the second output of the circuit and the second input of the differential stage.

9. A circuit for generating first and second triangular waveforms opposite in phase to each other, the circuit comprising:
   a first capacitor having a first plate coupled to a first output at which the first triangular waveform is produced and a second plate coupled to a second output at which the second triangular waveform is produced;
   a differential stage having first and second inputs and an output, the first input being coupled to a first voltage reference and the output of the differential stage being coupled to the first capacitor;

a first resistor coupled between the first output of the circuit and the second input of the differential stage; and a second resistor coupled between the second output of the circuit and the second input of the differential stage.

10. The circuit of claim 9, further comprising:

a first switch coupled between the first plate of the first capacitor and a second voltage reference and having a control terminal; and a second switch coupled between the second plate of the first capacitor and the second voltage reference and having a control terminal.

11. The circuit of claim 10, further comprising a comparator having first and second outputs coupled to the first and second switches, respectively, the comparator also having a first input coupled to one of the first and second outputs of the circuit and a second input coupled to a signal reference, the comparator being structured to produce respectively at the first and second outputs first and second control signals that vary in opposition to each other.

12. The circuit of claim 11, further comprising:

a third switch coupled between the signal reference and the second input of the comparator wherein the signal reference is a maximum voltage reference for the first and second triangular waveforms, the third switch having a control terminal coupled to the first output of the comparator; and a fourth switch coupled between a minimum voltage reference and the second input of the comparator, the fourth switch having a control terminal coupled to the second output of the comparator.

13. The circuit of claim 12 wherein the first input of the comparator is coupled to the first output of the circuit and the comparator is structured to turn "off" the third switch and turn "on" the fourth switch in response to the first triangular waveform attaining the maximum voltage reference and is structured to turn "on" the third switch and turn "off" the fourth switch in response to the first triangular waveform attaining the minimum voltage reference.

14. The circuit of claim 9, further comprising:

a second capacitor coupled between the output of the differential stage and the first plate of the first capacitor; and a third capacitor coupled between the output of the differential stage and the second plate of the first capacitor.

15. The circuit of claim 9, further comprising a second capacitor in parallel with the first capacitor.

16. A method of generating first and second triangular waveforms opposite in phase to each other, the method comprising:

providing a first capacitor having a first plate coupled to a first output at which the first triangular waveform is produced and a second plate coupled to a second output at which the second triangular waveform is produced;

connecting the first plate to a first low voltage reference to cause the first triangular waveform to fall;

disconnecting the first plate from the first low voltage reference in response to either detecting that the first triangular waveform's voltage has reached a second low voltage reference or detecting that the second triangular waveform's voltage has reached a high voltage reference;

connecting the second plate to the first low voltage reference in response to either detecting that the first triangular waveform's voltage has reached the second low voltage reference or detecting that the second triangular waveform's voltage has reached the high voltage reference;

disconnecting the second plate from the first low voltage reference in response to either detecting that the first triangular waveform's voltage has reached the high voltage reference or detecting that the second triangular waveform's voltage has reached the second low voltage reference; and re-connecting the first plate to the first low voltage reference in response to either detecting that the first triangular voltage has reached the high voltage reference or detecting that the second triangular waveform's voltage has reached the second low voltage reference.

17. The method of claim 16 wherein the acts of disconnecting the first plate from the first low voltage reference and reconnecting the first plate to the first low voltage reference is performed using a first switch coupled between the first plate and the low voltage reference and the first switch is controlled by a comparator having a first input coupled to one of the first and second outputs.

18. The method of claim 17 wherein the act of disconnecting the first plate from the first low voltage reference includes using the comparator to compare the either the first triangular waveform's voltage or the second triangular waveform's voltage to a reference signal at a second input of the comparator, the second input being coupled by a second switch to the second low voltage reference and by a third switch to the high voltage reference.

19. The method of claim 18, further comprising controlling the second and third switches using an output of the comparator.

20. The method of claim 16, further comprising controlling a middle voltage of the first and second triangular waveform signals using a differential amplifier having an output coupled to first the capacitor, a first input coupled to a reference signal, and a second input coupled to the first output by a first resistor and to the second output by a second resistor.

* * * * *